(12) United States Patent
Franklin et al.

(10) Patent No.: US 6,400,611 B1
(45) Date of Patent: Jun. 4, 2002

(54) INDEPENDENT ASYNCHRONOUS BOOT BLOCK FOR SYNCHRONOUS NON-VOLATILE MEMORY DEVICES

(75) Inventors: Dirk R. Franklin, Los Gatos; Edward S. Hui, Cupertino, both of CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/816,801

(22) Filed: Mar. 23, 2001

(51) Int. Cl.[7] .................................................. G11C 7/00
(52) U.S. Cl. .................... 365/185.33; 365/233; 365/240
(58) Field of Search ....................... 365/185.33, 230.03, 365/233, 63, 240, 185.11

(56) References Cited

U.S. PATENT DOCUMENTS

| 5,197,034 | A | 3/1993 | Fandrich et al. | 365/227 |
|---|---|---|---|---|
| 5,402,383 | A | 3/1995 | Akaogi | 365/218 |
| 5,502,835 | A | 3/1996 | Le et al. | 395/496 |
| 6,026,465 | A | 2/2000 | Mills et al. | 711/103 |
| 6,259,271 | B1 * | 7/2001 | Couts-Martin et al. | 326/40 |

* cited by examiner

Primary Examiner—Son T. Dinh
(74) Attorney, Agent, or Firm—Thomas Schneck; John P. McGuire, Jr.

(57) ABSTRACT

A non-volatile memory device having a main memory that operates synchronously with the system clock and an asynchronous boot block. The boot block can be activated to operate asynchronously upon initial power up or can be switched from synchronous to asynchronous mode upon receipt of a command signal by control logic circuitry within the device.

20 Claims, 2 Drawing Sheets

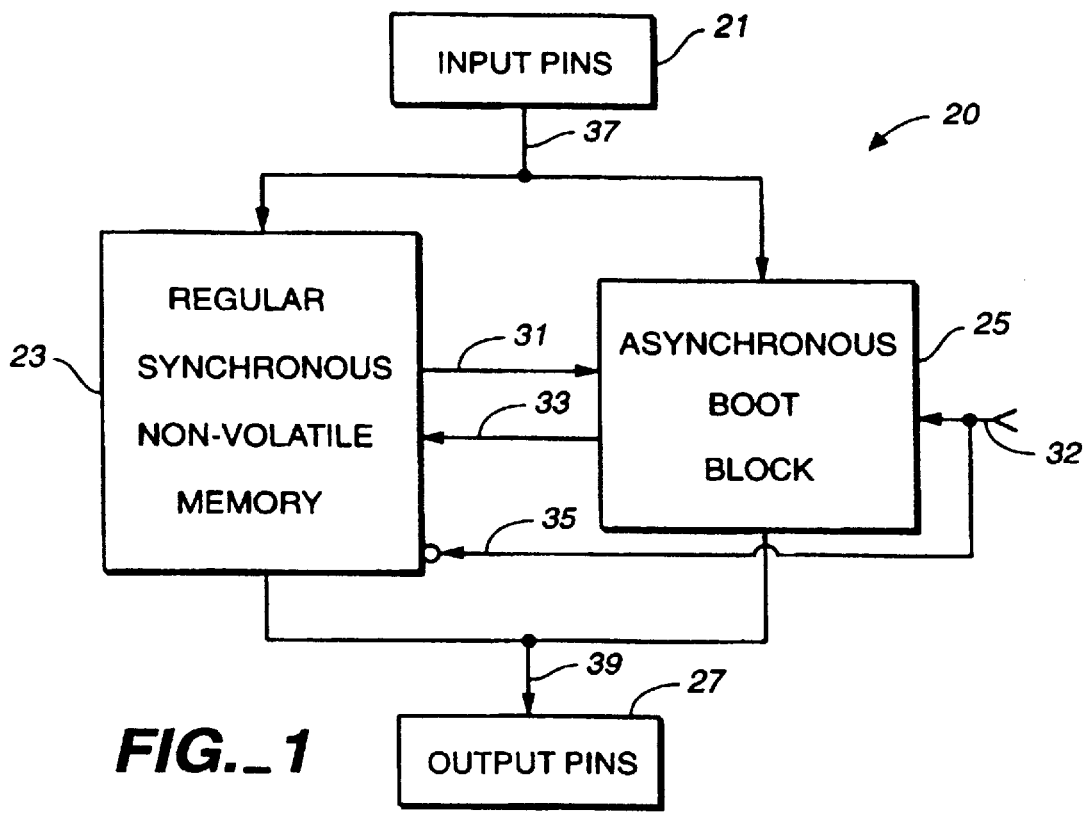
FIG._1
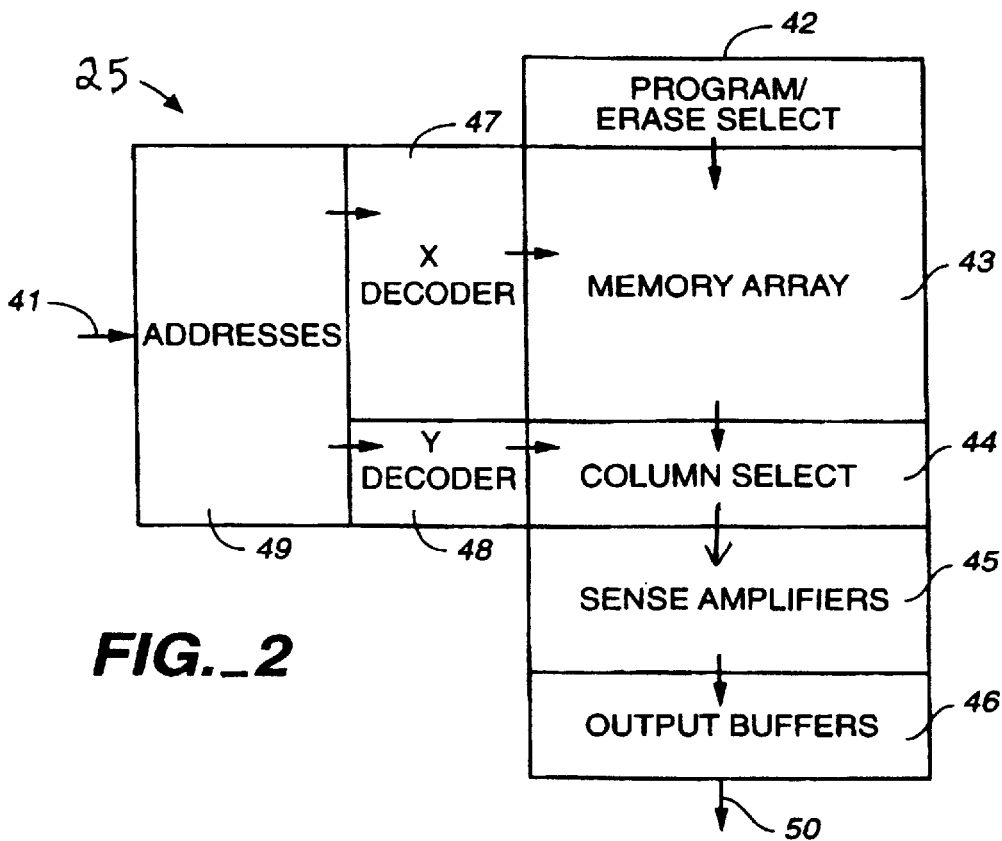
FIG._2

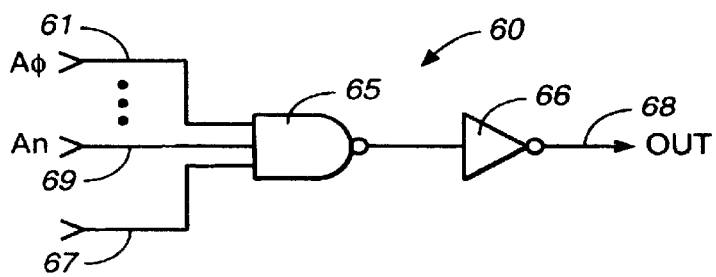
FIG._3
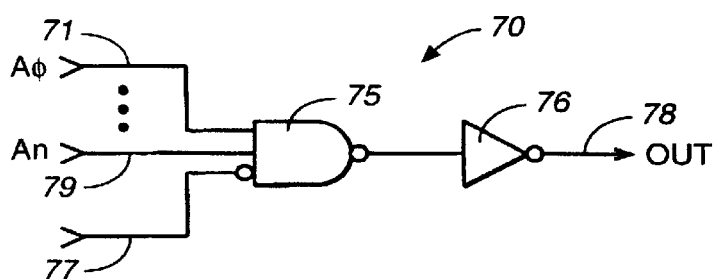
FIG._4
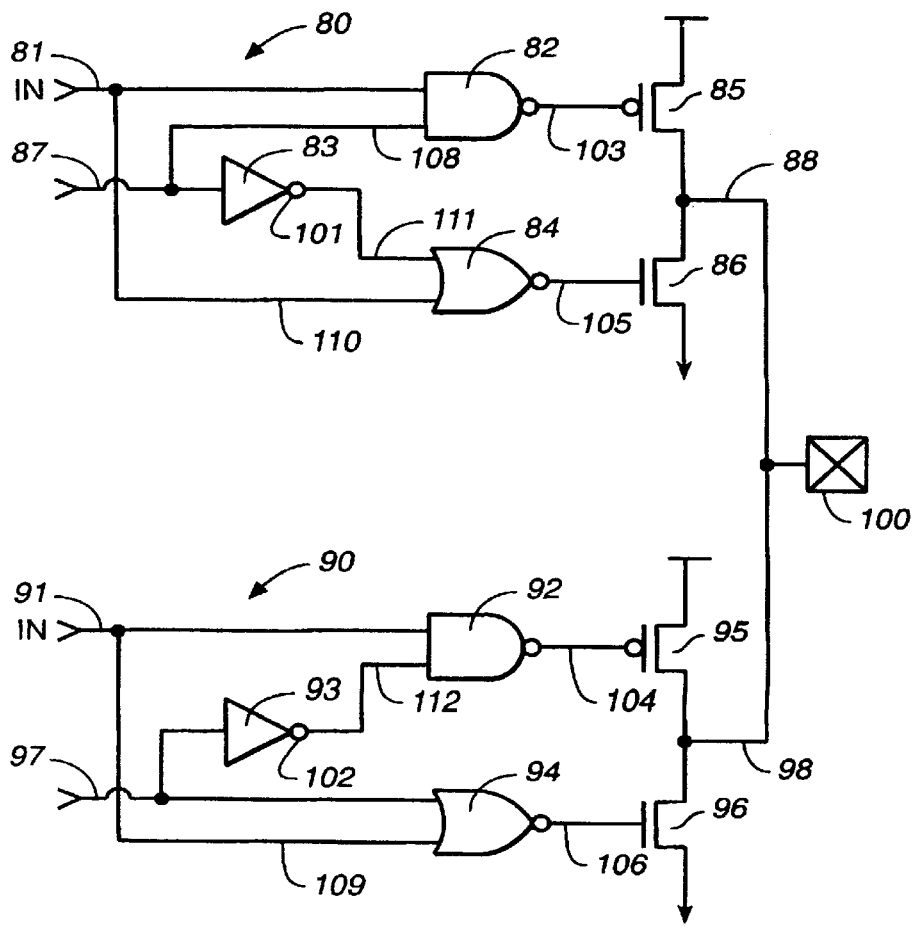
FIG._5

INDEPENDENT ASYNCHRONOUS BOOT BLOCK FOR SYNCHRONOUS NON-VOLATILE MEMORY DEVICES

TECHNICAL FIELD

The present invention relates to the field of non-volatile semiconductor memory devices, and more particularly, to a synchronous non-volatile memory device having an independent asynchronous boot block.

BACKGROUND ART

Non-volatile memory devices include a variety of semiconductor memory devices which have cells that maintain their data when the power is removed from the devices. Types of non-volatile memory devices include flash memories and electrically erasable programmable read only memories (EEPROM), as well as a variety of other device constructions. Typically, these types of memories operate asynchronously or, synchronously with a device system clock, in order to read data from the memory array and to program/write data into the memory array.

Often times, non-volatile devices include a boot block, which is a dedicated area of the memory which is used to store special programs such as an operating system, a BIOS (Basic Input Output System), and the like. Generally, the data in these boot blocks are accessed the same way the rest of memory is accessed. Therefore a synchronous non-volatile device will tend to access data in boot block synchronously with the clock used for the rest of the memory array. The disadvantage to this is that the clock signal and read commands need to be established before the data from the boot block can be accessed. It would be advantageous to be able to access the data from the boot block right away after power up without having to set up the clock or read commands. To do so the boot block would need to operate asynchronously with respect to the regular synchronous main memory portion of the memory device.

U.S. Pat. No. 5,197,034 to Fandrich et al. discloses a non-volatile memory including a main block and a boot block. Circuitry means are coupled to receive a control signal as a control input for allowing the boot block to be updated when the control signal is in a first voltage state and for generating a power off signal to switch the memory into a substantially powered off state when the control signal is in another voltage state.

U.S. Pat. No. 5,402,383 to Akaogi discloses an electrically erasable non-volatile semiconductor memory device for selective use in boot block type or normal type flash memory devices. The device has a memory cell array, a first erase unit, a second erase unit, and an operation establish unit. When a first operation mode is established, the erasing operation of the memory cell array is carried out by a first erase unit only. When a second operation mode is established, the erasing operation of the first erase unit is disabled and the second erase unit is activated to carry out the erase operation. Therefore, the change between the boot block flash memory and a normal-type flash memory can be realized by changing an established value of the operation mode unit.

U.S. Pat. No. 5,502,835 to Le et al. describes a method for synchronously accessing memory in which an integrated circuit microprocessor reads data from an external memory device through early overlapping memory access cycles, thus allowing efficient accesses to slower speed memory. The circuitry includes a boot region that stores the boot routine. The boot region is part of the chip select generation unit shown in FIG. 13 of the Le et al. patent, and appears to be synchronous.

It is an object of the present invention to provide a synchronous non-volatile memory device having a boot block that can be accessed asynchronously and can still be programmed/erased in a synchronous operation.

It is a further object of the present invention to provide a synchronous non-volatile memory device that can either allow the asynchronous boot block to be active after the device is initially powered up or allow switching from synchronous operation to activate the asynchronous boot block upon the assertion of a regular synchronous memory operational command.

SUMMARY OF THE INVENTION

The above objects have been achieved by a nonvolatile memory device having a main memory block that operates synchronously with the system clock and an independent asynchronous boot block. This device construction can be used upon initial power up and system reset operations for configuration of the microprocessor/memory controller in which the device is used. The synchronous non-volatile memory device includes control logic circuitry which can allow the asynchronous boot block to be active after initial power up or can allow the boot block to be activated in synchronous mode and then be switched to asynchronous mode. This allows data to be read immediately from the boot block without having to wait for the clock or read command signals to be established.

BRIEF DESCRIPTION OF THE DRAWINGS

FIG. 1 is a block diagram of the synchronous non-volatile memory device of the present invention.

FIG. 2 is a block diagram of the asynchronous boot block.

FIG. 3 is a circuit diagram of an x-decoder circuit block in the asynchronous boot block.

FIG. 4 is a circuit diagram of an x-decoder circuit in the main memory block.

FIG. 5 is a circuit diagram of the output buffers of the boot block and main memory block.

BEST MODE FOR CARRYING OUT THE INVENTION

With reference to FIG. 1, the non-volatile memory device 20 of the present invention is made up of a regular synchronous non-volatile memory block 23 and an asynchronous boot block 25. Both the regular synchronous non-volatile memory block 23 and the asynchronous boot block 25 are blocks of memory circuits which may include address inputs, x and y decoders, column selects for read, program and erase, non-volatile memory arrays, sense amplifiers, and output buffers. The memory device 20 includes a plurality of input pins 21 and output pins 27 for receiving commands and outputting commands to and from the memory device 20. Signal lines 31 and 33 transmit commands between the main memory block 23 and the asynchronous boot block 25. A boot block enable signal 32 is input into the asynchronous boot block 25 and is inverted 35 before being input into the regular main memory block.

With reference to FIG. 2, the asynchronous boot block 25 receives a signal 41 to the address portion of the block 49. The x-decoder 47 and y-decoder 48, along with column select 44 and program/erase select 42, determine which block in the memory area 43 will be selected for read, program, and erase operations. The boot block 25 also includes sense amplifiers 45 and output buffers 46 which are used to buffer the output signal 50.

The asynchronous boot block 25 can be activated in at least two ways. One way is to issue a "Mode Register Set" command, which is a regular synchronous memory operational command, to activate the asynchronous boot block and to disable the regular synchronous non-volatile memory block. In this case, the boot block would be operating in synchronous mode, for program and erase, and in asynchronous mode for read. This would allow most of the functional operations, such as read, program and erase, to be accessible to the asynchronous boot block instead of the regular main memory block. A second way to activate the asynchronous boot block is to have the asynchronous boot block be active, instead of the synchronous non-volatile memory block, upon power up of the device. A mode register set command can be issued to deactivate the asynchronous boot block at such a time as when it is desired to enable the synchronous main memory block. The mode register set command is normally a synchronous chip operation. Since one would be entering this command in the asynchronous boot block mode of operation, some of the input pin functions such as clock, row access (RAS#), and column access (CAS#), etc., cannot be disabled but can be set to the respective nonactive states at VIL or VIH at the inputs until they are used for input commands. In this way, while the chip is in asynchronous boot block mode of operation, the synchronous command sequence of programming and erasing can still be issued and functional. This can eliminate the great effort that would be needed to design a set of asynchronous logic for programming and erasing the asynchronous boot block.

With reference to FIGS. 3 and 4, examples of the control logic circuitry which is used to enable and disable the asynchronous boot block is shown. The circuit of FIG. 3 is an x-decoder in the asynchronous boot block, while the circuit of FIG. 4 is an x-decoder in the synchronous main memory block. With reference to FIG. 3, the x-decoder logic circuit 60 includes a NAND gate 65 having a plurality of input terminal 61, 69 receiving input signals A0 –An. One 67 of the input terminals receives a BOOT_BLOCK_ENABLE signal. The output of the NAND gate 65 is inverted by inverter 66 producing an output signal OUT on a output terminal 68. Similarly in FIG. 4, a NAND gate 75 receives a plurality of input signals A0 –An on input terminals 71, 79, including a BOOT_BLOCK_ENABLE signal on an input terminal 77. However, the BOOT_BLOCK_ENABLE signal is inverted 72 before being input to the NAND gate 75. The output of the NAND gate 75 is inverted by inverter 76 producing an output 78. The BOOT_BLOCK_ENABLE signal can be made active or logically high with the "mode register set" command, or can be made logically high after power up in order to indicate that the asynchronous boot block is activated. If the asynchronous boot block is not activated, the BOOT_BLOCK_ENABLE signal will be at a logical low state. In FIG. 3, the output signal OUT will follow the logic combination of the input A0 to input An, only if the BOOT_BLOCK_ENABLE signal is at a logic high state. Otherwise, the output will remain in a logic low state as long as the BOOT_BLOCK_ENABLE signal stays at a logic low state, which indicates that the asynchronous boot block is not activated. With reference to FIG. 4, in the x-decoder circuit block 70 of the synchronous main memory block, the output signal OUT at terminal 78 will follow the logic combination of the input signals A0 to input signal An, if the BOOT_BLOCK_ENABLE signal is at a logic low state. This indicates that the asynchronous boot block is not activated and that the regular synchronous main memory block is enabled.

With reference to FIG. 5, the output buffer circuitry of the boot block and main memory block are shown. The output buffer control logic circuitry 80 of the asynchronous boot block is combined with the output buffer control logic circuitry 90 of the synchronous main memory block, as the outputs 88, 98 of each of the buffers provide an output signal at output pin 100. The first logic block 80, which is the output buffer of the asynchronous boot block, consists of a first inverter 83 which receives the BOOT_BLOCK_ENABLE signal on one input terminal 87 and produces an intermediate control signal on an output terminal 101 of the inverter 83. A NOR gate 84 has a first input terminal 111 coupled to the output terminal 101 of the first inverter 83 and receives the intermediate control signal at the first input terminal 111. The NOR gate 84 receives the first input signal at a second input terminal 110. The NOR gate 84 produces a first gate signal at the NOR gate output 105. A NAND gate 82 receives the BOOT_BLOCK_ENABLE signal at a first input terminal 108 and receives an input signal 81 at a second input terminal 81. A second gate signal is produced at the output 103 of the NAND gate 82. The two gate signals are supplied to the gates of a CMOS inverter consisting of a PMOS transistor 85 and an NMOS transistor 86. The PMOS transistor 85 receives the gate signal from the output 103 of the NAND gate 82, and the NMOS transistor 86 receives the gate signal from the output 105 of the NOR gate 84. The inverter formed by the PMOS 85 and the NMOS transistor 86 produces an output signal at node 88 which is sent to the output pin 100.

The control logic circuit 90 of the synchronous non-volatile memory device block includes an inverter 93 which receives the BOOT_BLOCK_ENABLE signal on a first input terminal 97 and produces an intermediate control signal on its output terminal 102. A NAND gate 92 has a first input terminal 112 coupled to the output terminal 102 of the first inverter 93 and receives the intermediate control signal 102, and also receives the first input signal at a second input terminal 91. The NAND gate produces a first gate signal at the NAND output 104. A NOR gate 94 receives the BOOT_BLOCK_ENABLE signal at a first input terminal 97 and receives the input signal at a second input terminal 91. The NOR gate 94 produces a second gate signal at its output 106. The first gate signal goes to the gate terminal of a PMOS transistor 95 and the second gate signal goes to the gate terminal of an NMOS transistor 96. The PMOS transistor 95 and the NMOS transistor 96 form an inverter which produces an output on node 98 which goes to the output pin 100.

The input terminals 87 and 97 are described above as receiving the BOOT_BLOCK_ENABLE signal directly. Alternatively, the input terminals 87, 97 can also receive signals that are the result of the BOOT_BLOCK_ENABLE signal being logically combined with other logic control signals.

When the asynchronous boot block is activated, the BOOT_BLOCK_ENABLE signal will be at a logic high and will allow the input signals to control the logic circuitry to drive the output 100 at the same time the BOOT_BLOCK_ENABLE signal at logic high will turn off logic circuit 90 so that the output buffer and the synchronous main memory block is disabled. When the asynchronous boot block is not activated, the BOOT_BLOCK_ENABLE signal will be at a logic low value such that the output buffer of the asynchronous boot block 80 will be disabled and the low signal to the output buffer 90 of the synchronous main memory block will be enabled. Therefore, even though the output pad 100 is driven by both output buffers, only one output buffer will be allowed to drive the pad at any one time and the other buffer will be in a tristate mode. This allows for the enabling and disabling of the asynchronous boot block even after the synchronous memory block has been operating.

What is claimed is:

1. A non-volatile memory, comprising:
    a memory array including a synchronous main memory block and an asynchronous boot block;
    a plurality of input pins and a plurality of output pins coupled to the memory array;
    control logic circuitry for receiving address signals, asynchronous control signals, and synchronous control signals including a clock signal; and
    means for activating and deactivating the asynchronous boot block.

2. The non-volatile memory of claim 1 wherein the means for activating and deactivating the asynchronous boot block includes applying a first control signal to a first input pin coupled to the control logic circuitry, the control logic circuitry providing an output that indicates whether the asynchronous boot block is activated or deactivated.

3. The non-volatile memory of claim 1 wherein the control logic circuitry includes a first x-decoder circuit block in the asynchronous boot block and a second x-decoder circuit block in the synchronous main memory block, said first and second x-decoder receiving a first control signal and each providing an output that is indicative of whether the respective asynchronous or synchronous block is enabled.

4. The non-volatile memory of claim 3 wherein the output of the first x-decoder block is in an opposite logic state from the output of the second x-decoder block.

5. The non-volatile memory of claim 1 wherein the asynchronous boot block is activated upon receipt of power-up signal or a mode register set signal by the input pins.

6. The non-volatile memory of claim 5 wherein the asynchronous boot block is deactivated and the synchronous main memory block is activated upon receipt of a mode register set signal by the input pins.

7. The non-volatile memory of claim 1 wherein the control logic circuitry includes a first logic block in an output buffer in the synchronous main memory block and a second logic block in an output buffer in the asynchronous boot block, said first and second logic blocks receiving a first control signal and a first input signal and producing an output on one of the output pins.

8. The non-volatile memory of claim 7 wherein each of the first logic blocks includes:
    a first inverter receiving the first control signal on an input terminal producing an intermediate control signal on an output terminal;
    an NAND gate having a first input terminal coupled to the output terminal of the first inverter and receiving the intermediate control signal at the first input terminal, and said NAND gate receiving the first input signal at a second input terminal and producing a first gate signal at a NAND output;
    a NOR gate receiving the first control signal at a first input and receiving the first input signal at a second input and producing a second gate signal at a NOR output; and
    a CMOS inverter, including a PMOS transistor having a gate coupled to the NAND output, a drain coupled to a voltage supply, and a source coupled to the one of the said output pins, and an NMOS transistor having a gate coupled to the NOR output, a drain coupled to the one of said output pins and a source connected to a ground potential, said gate of said PMOS transistor receiving said first gate signal and said gate of said NMOS transistor receiving said second gate signal, said output being produced on the one of said output pins.

9. The non-volatile memory of claim 7 wherein each of the second logic blocks includes:
    a first inverter receiving the first control signal on an input terminal and producing an intermediate control signal on an output terminal;
    a NOR gate having a first input terminal coupled to the output terminal of the first inverter and receiving the intermediate control signal at the first input terminal, said NOR gate receiving the first input signal at a second terminal and producing a first gate signal at a NOR output;
    a NAND gate receiving the first control signal at a first input and receiving the first input signal at a second input and producing a second gate signal at a NAND output; and
    a CMOS inverter including a PMOS transistor having a gate coupled to the NAND output, a drain coupled to a voltage supply and a source coupled to the one of said output pins, and an NMOS transistor having a gate coupled to the NOR output, a drain coupled to the one of said output pins and a source connected to a ground potential, said gate of said PMOS transistor receiving said first gate signal and said gate of said NMOS transistor receiving said second gate signal, said output being produced on the one of said output pins.

10. The non-volatile memory of claim 1 wherein the memory array is a flash memory type.

11. The non-volatile memory of claim 1 wherein the asynchronous boot block comprises:
    a plurality of address buffers, each having an input for receiving a boot block input signal, and each producing an address signal;
    an x-decoder and a y-decoder, each receiving one of the address signals and producing a decoder output;
    a non-volatile memory array electrically coupled to the x-decoder and the y-decoder and receiving the decoder outputs, the non-volatile memory also receiving select signals from a program/erase select circuit and providing memory output signals to a column select circuit; and
    a plurality of sense amplifiers electrically coupled to the column select circuit and a plurality of output buffers electrically coupled to the plurality of sense amplifiers, the sense amplifiers and output buffers receiving the memory output signals and producing a boot block output signal.

12. The non-volatile memory of claim 11 wherein the asynchronous boot block operates separately from the synchronous main memory block.

13. A non-volatile memory, comprising:
    a memory array including a synchronous main memory block and an asynchronous boot block, said boot block operating separately from said main memory block;
    a plurality of input pins and a plurality of output pins coupled to the memory array;
    control logic circuitry for receiving address signals, asynchronous control signals, and synchronous control signals including a clock signal, said control logic circuitry including a first x-decoder circuit block in the asynchronous boot block and a second x-decoder circuit block in the synchronous main memory block, said first and second x-decoder circuit blocks receiving a first control signal and each providing an output that is indicative of whether the respective asynchronous or synchronous block is enabled; and means for activating and deactivating the asynchronous boot block.

14. The non-volatile memory of claim 13 wherein the means for activating and deactivating the asynchronous boot block includes applying a first control signal to a first input pin coupled to the control logic circuitry, the control logic circuitry providing an output that indicates whether the asynchronous boot block is activated or deactivated.

15. The non-volatile memory of claim 13 wherein the output of the first x-decoder block is in an opposite logic state from the output of the second x-decoder block.

16. The non-volatile memory of claim 13 wherein the asynchronous boot block is activated upon receipt of power-up signal or a mode register set signal by the input pins.

17. The non-volatile memory of claim 16 wherein the asynchronous boot block is deactivated and the synchronous main memory block is activated upon receipt of a mode register set signal by the input pins.

18. The non-volatile memory of claim 13 wherein the control logic circuitry includes a first logic block in an output buffer in the synchronous main memory block and a second logic block in an output buffer in the asynchronous boot block, said first and second logic blocks receiving a first control signal and a first input signal and producing an output on one of the output pins.

19. The non-volatile memory of claim 18 wherein each of the first logic blocks includes:

a first inverter receiving the first control signal on an input terminal producing an intermediate control signal on an output terminal;

an NAND gate having a first input terminal coupled to the output terminal of the first inverter and receiving the intermediate control signal at the first input terminal, and said NAND gate receiving the first input signal at a second input terminal and producing a first gate signal at a NAND output;

a NOR gate receiving the first control signal at a first input and receiving the first input signal at a second input and producing a second gate signal at a NOR output; and a CMOS inverter, including a PMOS transistor having a gate coupled to the NAND output, a drain coupled to a voltage supply, and a source coupled to the one of the said output pins, and an NMOS transistor having a gate coupled to the NOR output, a drain coupled to the one of said output pins and a source connected to a ground potential, said gate of said PMOS transistor receiving said first gate signal and said gate of said NMOS transistor receiving said second gate signal, said output being produced on the one of said output pins.

20. The non-volatile memory of claim 18 wherein each of the second logic blocks includes:

a first inverter receiving the first control signal on an input terminal and producing an intermediate control signal on an output terminal;

a NOR gate having a first input terminal coupled to the output terminal of the first inverter and receiving the intermediate control signal at the first input terminal, said NOR gate receiving the first input signal at a second terminal and producing a first gate signal at a NOR output;

a NAND gate receiving the first control signal at a first input and receiving the first input signal at a second input and producing a second gate signal at a NAND output; and a CMOS inverter including a PMOS transistor having a gate coupled to the NAND output, a drain coupled to a voltage supply and a source coupled to the one of said output pins, and an NMOS transistor having a gate coupled to the NOR output, a drain coupled to the one of said output pins and a source connected to a ground potential, said gate of said PMOS transistor receiving said first gate signal and said gate of said NMOS transistor receiving said second gate signal, said output being produced on the one of said output pins.

* * * * *